(12) United States Patent
Mercier et al.

(10) Patent No.: US 10,939,582 B2
(45) Date of Patent: Mar. 2, 2021

(54) METHODOLOGY FOR BLINDMATING AND COOLING ELECTRONIC MODULES

(71) Applicant: Raytheon Company, Waltham, MA (US)

(72) Inventors: Dennis W. Mercier, Hudson, MA (US); Kenneth P. Walsh, Jr., Andover, MA (US); Gregory S. Renaud, Dracut, MA (US); Derek B. Wells, Wilmington, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/824,910

(22) Filed: Mar. 20, 2020

(65) Prior Publication Data

US 2020/0315063 A1    Oct. 1, 2020

Related U.S. Application Data (60) Provisional application No. 62/825,347, filed on Mar. 28, 2019.

(51) Int. Cl.
*H05K 7/20* (2006.01)
*F16B 37/12* (2006.01)
(Continued)

(52) U.S. Cl.
CPC ....... *H05K 7/20272* (2013.01); *F16B 37/125* (2013.01); *H01R 12/7005* (2013.01);
(Continued)

(58) Field of Classification Search
CPC ........... F16B 37/044; F16B 37/122–27; H05K 7/1454
See application file for complete search history.

(56) References Cited

U.S. PATENT DOCUMENTS

| | | | | |
|---|---|---|---|---|
| 3,130,765 A | * | 4/1964 | Neuschotz | ............ F16B 37/122 411/108 |
| 3,233,645 A | * | 2/1966 | Neuschotz | ............ F16B 37/122 411/110 |

(Continued)

FOREIGN PATENT DOCUMENTS

DE        198 44 281 A1      5/2000

OTHER PUBLICATIONS

Notification of Transmittal of the International Search Report and the Written Opinion of the International Searching Authority, or the Declaration, PCT/US2020/023830, dated Jun. 22, 2020, 1 page.

(Continued)

*Primary Examiner* — Robert J Hoffberg
(74) *Attorney, Agent, or Firm* — Daly, Crowley, Mofford & Durkee LLP (57) ABSTRACT

An apparatus is disclosed comprising: a chassis including an array plate, the array plate having a plurality of first openings formed thereon; a plurality of floating inserts, each of the floating inserts being disposed in a different one of the first openings; a main board having a plurality of second openings formed thereon, the main board being coupled to the array plate via a plurality of alignment pins, each of the alignment pins extending through a respective one of the plurality of floating inserts and into a respective one of the plurality of second openings; and an electronic module coupled to the main board, the electronic module including a first connector and at least one alignment socket, the first connector being coupled to a second connector that is disposed on the main board, the alignment socket being arranged to receive a given one of the alignment pins.

22 Claims, 11 Drawing Sheets

(51) Int. Cl.
    *H05K 7/14*     (2006.01)
    *H01R 12/70*     (2011.01)
    *H01R 43/26*     (2006.01)
    *H05K 1/18*     (2006.01)
    *H05K 3/30*     (2006.01)
    *G01S 7/03*     (2006.01)
    *G01S 7/02*     (2006.01)

(52) U.S. Cl.
    CPC ............. *H01R 43/26* (2013.01); *H05K 1/181* (2013.01); *H05K 3/303* (2013.01); *H05K 7/1454* (2013.01); *H05K 7/20772* (2013.01); *G01S 7/03* (2013.01); *G01S 2007/028* (2013.01); *H05K 2201/10189* (2013.01); *H05K 2201/10325* (2013.01)

(56) References Cited

U.S. PATENT DOCUMENTS

| | | | | |
|---|---|---|---|---|
| 3,481,244 A * | 12/1969 | Mason | ................ | F16B 37/065 |
| | | | | 411/41 |
| 4,815,986 A | 3/1989 | Dholoo | | |
| 5,228,865 A * | 7/1993 | Douty | ................ | H01R 13/748 |
| | | | | 248/27.1 |
| 5,385,481 A * | 1/1995 | Kotyuk | ............. | H01R 13/6315 |
| | | | | 439/248 |
| 5,622,511 A * | 4/1997 | Jarrett | ............... | H01R 13/6315 |
| | | | | 439/248 |
| 5,761,045 A * | 6/1998 | Olson | ................... | G06F 1/189 |
| | | | | 312/223.2 |
| 5,872,701 A * | 2/1999 | Hayden, Sr. | ....... | H01R 12/7005 |
| | | | | 361/741 |
| 5,930,118 A * | 7/1999 | Bernhardt | ............ | H05K 7/1454 |
| | | | | 361/728 |
| 5,993,241 A * | 11/1999 | Olson | ................. | H01R 13/629 |
| | | | | 439/160 |
| 6,024,523 A * | 2/2000 | Oudmayer | ............ | F16B 37/122 |
| | | | | 411/111 |
| 6,358,075 B1 * | 3/2002 | Tischner | ............ | H01R 13/6315 |
| | | | | 439/248 |
| 7,791,890 B2 * | 9/2010 | Ishida | ................. | H05K 7/1492 |
| | | | | 361/727 |
| 8,100,706 B2 * | 1/2012 | Matsuzawa | .......... | H05K 7/1454 |
| | | | | 439/247 |
| 8,477,504 B2 | 7/2013 | Bopp | | |
| 9,160,088 B2 * | 10/2015 | Rossman | ............. | H05K 7/1454 |
| 9,653,831 B2 | 5/2017 | Hoyack et al. | | |
| 2005/0037636 A1 | 2/2005 | Lan | | |
| 2015/0200474 A1 | 7/2015 | Rossman et al. | | |

OTHER PUBLICATIONS

International Search Report, PCT/US2020/023830, dated Jun. 22, 2020, 4 pages.
Written Opinion of the International Searching Authority, PCT/US2020/023830, dated Jun. 22, 2020, 8 pages.

* cited by examiner

METHODOLOGY FOR BLINDMATING AND COOLING ELECTRONIC MODULES

CROSS REFERENCE TO RELATED APPLICATION

This application claims the benefit of U.S. Provisional Application No. 62/825,347, filed Mar. 28, 2019 under 35 U.S.C. § 119(e) which application is hereby incorporated herein by reference in its entirety.

BACKGROUND

As radars trend towards higher power at lower costs, it is becoming increasingly difficult to find space to fit all necessary electronic components. Printed flex cables have been traditionally used in radar arrays to connect various electronic components, and edge cooling has been traditionally used to cool such electronic components. However, the use of flex cables is inefficient because it requires extra enclosure space to be provided in order to accommodate the flex cables' bend radius. Furthermore, edge-cooling may be insufficient to dissipate all of the heat that is generated by high-power electronic modules. Accordingly, the need exists for new radar enclosure designs that use alternative coupling or cooling methodologies.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, an apparatus is disclosed comprising: a chassis including an array plate, the array plate having a plurality of first openings formed thereon; a plurality of floating inserts, each of the floating inserts being disposed in a different one of the first openings, each of the floating inserts including a first floating insert member and a second floating insert member that is inserted in the first floating insert member and arranged to move laterally with respect to the first floating insert member; a main board having a plurality of second openings formed thereon, the main board being coupled to the array plate via a plurality of alignment pins, each of the alignment pins having a first portion and a second portion, the first portion of each of the alignment pins extending through a respective one of the plurality of second openings and into the second floating insert member of a respective one of the plurality of floating inserts; and at least one electronic module assembly coupled to the main board, the electronic module assembly having a first connector and at least one alignment socket that are formed on a first side of the electronic module assembly, the first connector being mated with a second connector that is disposed on the main board, and the alignment socket being mated with the second portion of a given one of the plurality of alignment pins.

According to aspects of the disclosure, an apparatus is disclosed comprising: a chassis including an array plate, the array plate having a plurality of first openings formed thereon; a plurality of floating inserts, each of the floating inserts being disposed in a different one of the first openings; a main board having a plurality of second openings formed thereon, the main board being coupled to the array plate via a plurality of alignment pins, each of the alignment pins extending through a respective one of the plurality of floating inserts and into a respective one of the second openings; and at least one electronic module assembly coupled to the main board, the electronic module assembly including a first connector and at least one alignment socket, the first connector being coupled to a second connector that is disposed on the main board, the alignment socket being arranged to receive a given one of the alignment pins.

According to aspects of the disclosure, an apparatus is disclosed comprising: a chassis including an array plate, the array plate having a plurality of first openings formed thereon; a plurality of floating inserts, each of the floating inserts being disposed in a different one of the first openings; a main board having a plurality of second openings formed thereon, the main board being coupled to the array plate via a plurality of alignment pins, each of the alignment pins extending through a respective one of the plurality of floating inserts and into a respective one of the plurality of second openings; and an electronic module coupled to the main board, the electronic module including a first connector and at least one alignment socket, the first connector being coupled to a second connector that is disposed on the main board, the alignment socket being arranged to receive a given one of the alignment pins.

According to aspects of the disclosure, a method is disclosed comprising: mounting a main board on an array plate of a chassis by using a plurality of floating inserts and a plurality of alignment pins, each of the floating inserts being disposed in a different respective opening in the array plate, and each of the alignment pins extending through a respective one of the floating inserts and into a respective opening in the main board; blind mating an electronic module assembly to the main board, the electronic module assembly including an alignment socket and a first connector, the blind mating including coupling the alignment socket with one of the plurality of alignment pins that is disposed adjacent to a second connector on the main board, and mating the first connector with the second connector, wherein the electronic module assembly and the main board are disposed on opposite sides of the array plate.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Before describing embodiments of the concepts, structures, and techniques sought to be protected herein, some terms are explained. In some embodiments, the term "I/O request" or simply "I/O" may be used to refer to an input or output request. In some embodiments, an 1/O request may refer to a data read or write request.

Figure 1A:
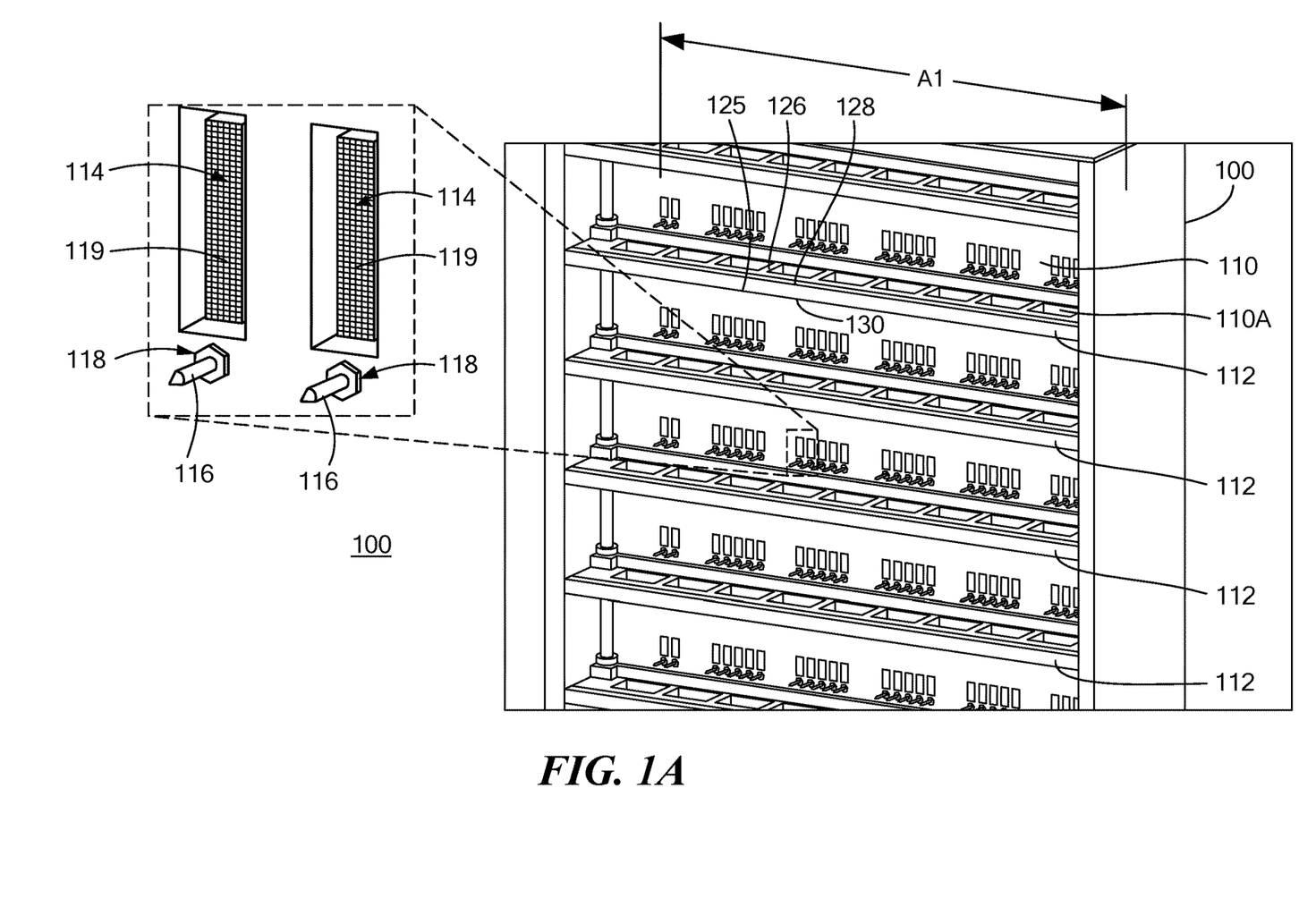
FIG. 1A is a perspective view of an electronic enclosure chassis, according to aspects of the disclosure.
Figure 1B:
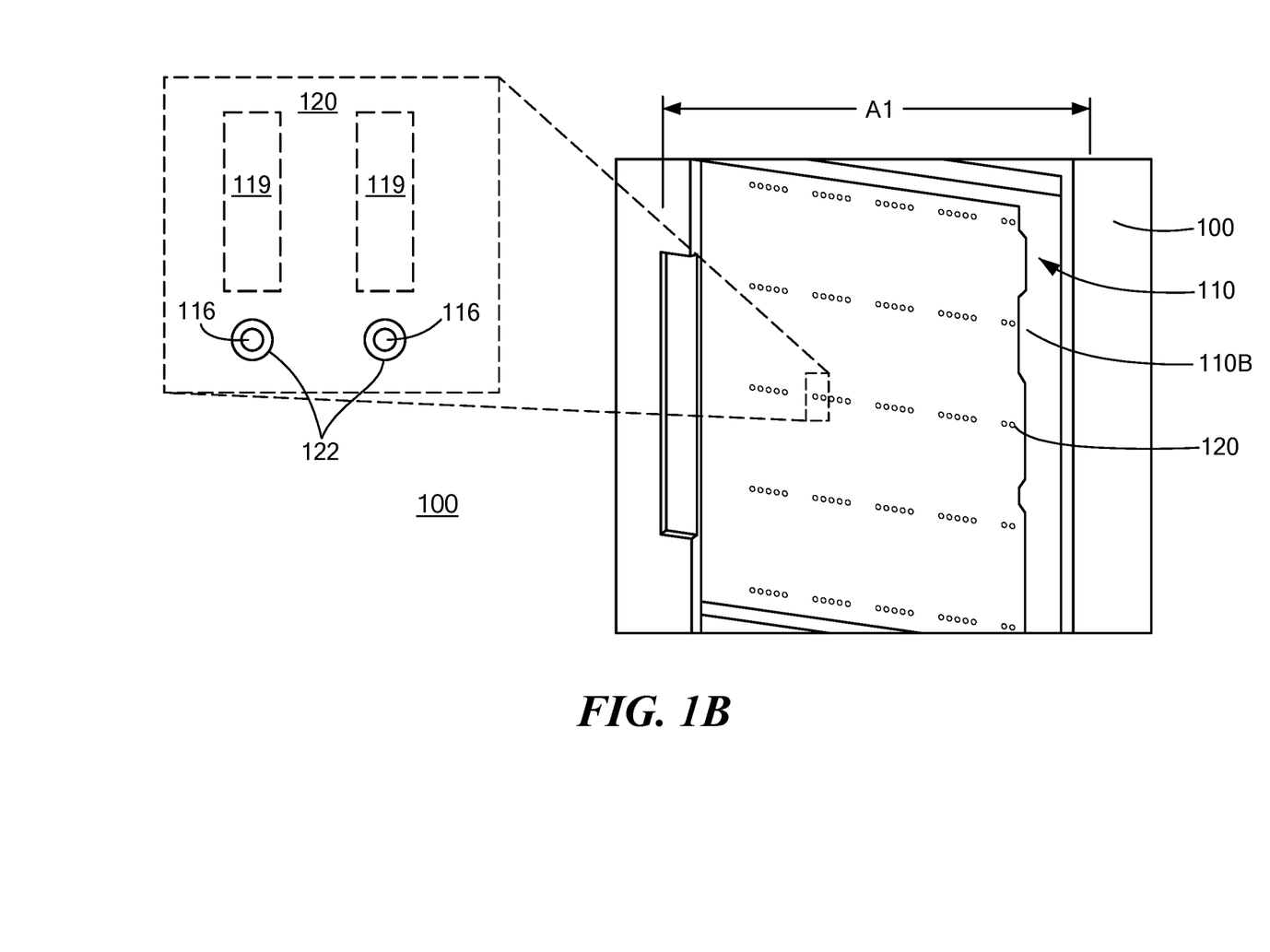
FIG. 1B is another perspective view of the electronic enclosure chassis of FIG. 1A, according to aspects of the disclosure.

FIGS. 1A-B show a perspective view of a chassis 100, according to aspects of the disclosure. The chassis 100 may be part of a radar array enclosure and/or any other suitable type of electronic device enclosure.

As illustrated, the chassis 100 may include an array plate 110 extending along a longitudinal axis A1 of the chassis 100, and a plurality of shelves 112 extending alongside the array plate 110. Each of the shelves 112 may include an inner side 126 that is adjacent to a surface 110A of the array plate 110, and an outer side 125 that is opposite the inner side 126. Each of the shelves 112 may further include a top surface 128 and a bottom surface 130 that are transverse (e.g., orthogonal, etc.) to the surface 110A of the array plate 110. As is further discussed below, the inner side 126 of each shelf 112 may be adjacent to the periphery of the chassis 100, and it may include a plurality of nozzles 402 (shown in FIG. 4A). The nozzles may be coupled to piping that is integrated into (or otherwise attached to) the shelves 112, and which is used to deliver liquid coolant to/from the nozzles 402. One or more alignment plates 404 (shown in FIG. 4A) may be disposed on the top surface 128 of any of the shelves 112, and one or more alignment plates 408 may be disposed on the bottom surface 130 of any of the shelves 112. As further discussed below, the alignment plates 404 and 408 may be arranged to receive various electronic module assemblies that are installed in the chassis 100, and the nozzles 402 may be arranged to connect the electronic modules assemblies to a cooling unit that is provided with the chassis 100.

A plurality of openings 114 may be formed in the array plate 110. Each of the openings 114 may be arranged to expose a different one of a plurality of electric connectors 119 formed on a main board 120. A plurality of openings 118 may be further formed in the array plate 110, and a respective floating insert 124 (shown in FIG. 2A) may be disposed in each of the openings 118. Each of the floating inserts 124 may be arranged to receive a different respective alignment pin 116, as shown. The main board 120 may be mounted adjacent to a surface 110B of the array plate 110, which is opposite the surface 110A. The main board 120 may include a plurality of openings 122 formed therein. Each of the openings 122 of the main board 120 may be aligned with a different one of the openings 118, and arranged to receive the end of the alignment pin 116 that is disposed in that opening 118 (or the opening's respective floating insert 124).

Although in the present example, the main board 120 includes a radar array midplane board, it will be understood that the present disclosure is not limited to any specific type of circuit board being mounted on the array plate 110. Although in the present example the connectors 119 are recessed within the openings 114, alternative implementations are possible in which one or more of the connectors 119 extend through the openings 118. Although in the present example the connector 119 is a female connector, it will be understood that alternative implementations are possible in which the connector 119 is a male connector. Stated succinctly, the connector 119 may include any suitable type of electric connector.

Figure 2A:
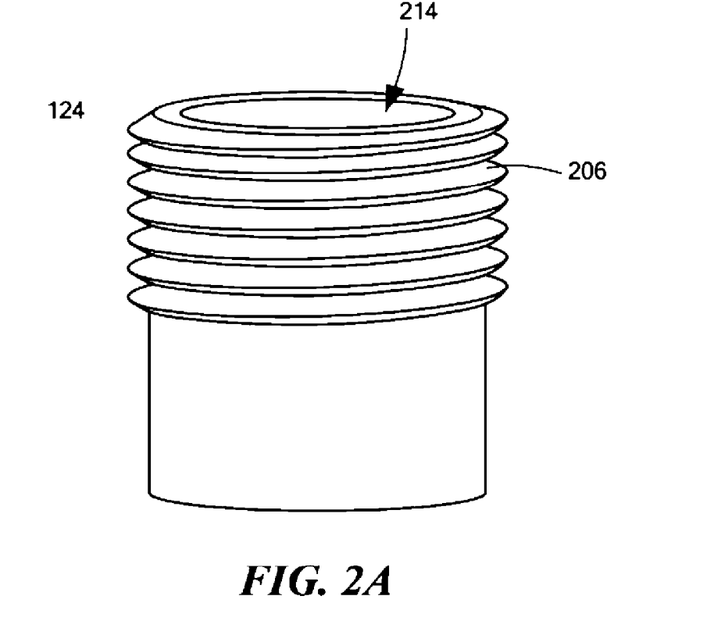
FIG. 2A is a perspective side view of a floating insert, according to aspects of the disclosure.
Figure 2B:
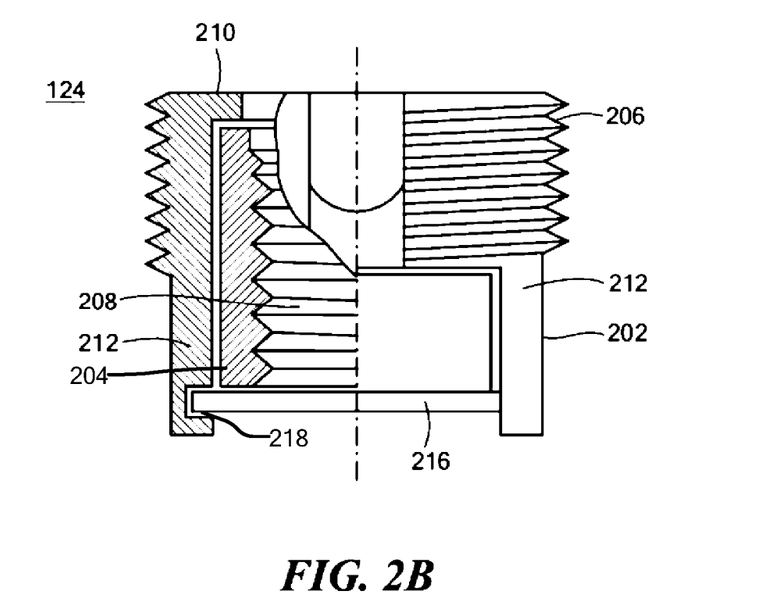
FIG. 2B is a cross-sectional side view of the floating insert of FIG. 2A, according to aspects of the disclosure.
Figure 2C:
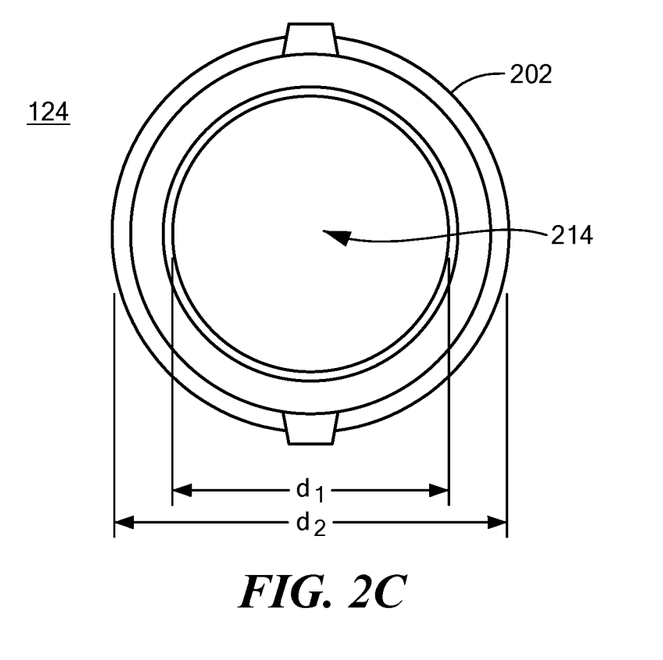
FIG. 2C is a top down view of the floating insert of FIG. 2A, according to aspects of the disclosure.

FIGS. 2A-C show an example of a floating insert 124 in further detail. As illustrated, the floating insert 124 may comprise an inner member 204 that is disposed inside an outer member 202. The outer member 202 and the inner member 204 may both have a cylindrical shape, and the inner member 204 may define a bore 214 for receiving a first portion 116A of any of the alignment pins 116. The outer member 202 may have a diameter D2 and the inner member may have a diameter D1 that is smaller than the diameter D2. The outer member 202 may have an outer thread 206 formed thereon and the inner member may have an inner thread 208 that is facing the bore 214. The outer member 202 may include a lip 210, which is formed around the circumference of the outer member 202, and which is coupled to a sidewall 212 of the outer member 202. The inner member 204 may be retained inside the outer member 202, between the lip 210 and a retention ring 216. The retention ring 216 may be partially disposed inside a groove 218 that is formed on an inner surface of the sidewall 212, and sized to prevent the inner member 204 from exiting the outer member 202. The inner member 204 may be arranged to move laterally and/or rotationally with respect to the outer member 202 when the inner member 204 is disposed in the outer member 202. In some implementations, the distance by which the inner member 204 can move relative to the outer member may be less than 1 mm. Additionally or alternatively, in some implementations, the floating insert may have a minimum radial float of 0.8 mm.

Figure 2D:
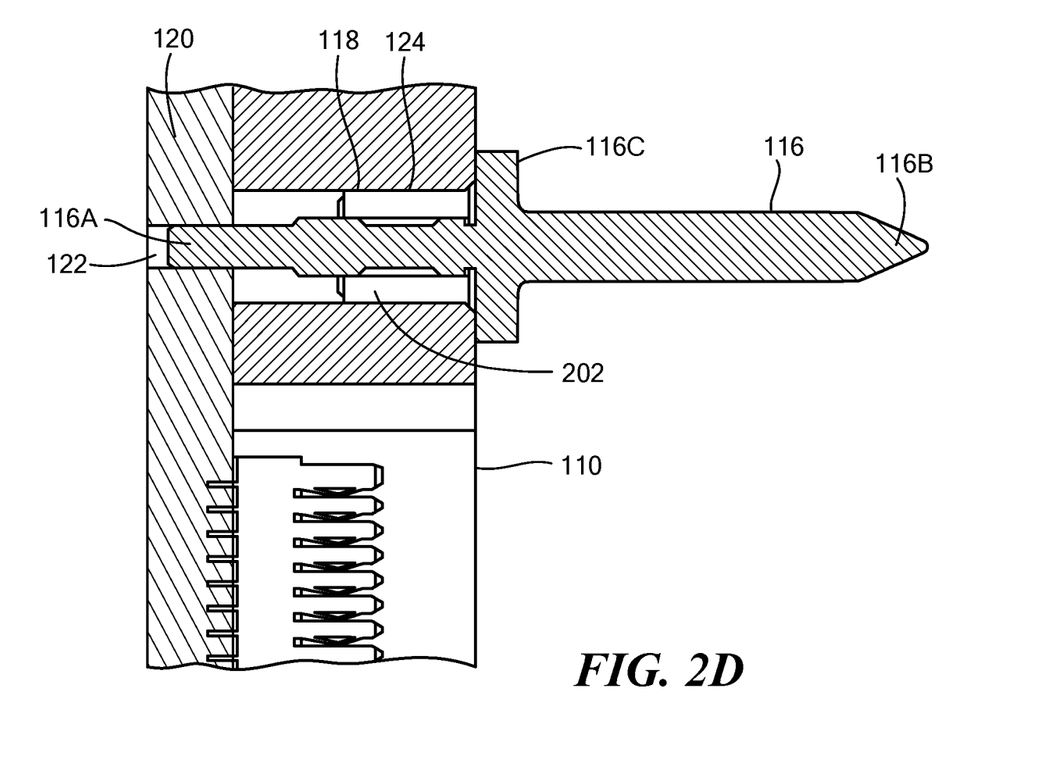
FIG. 2D is a partial view of the electronic enclosure chassis of FIG. 1A, which illustrates the use of the floating insert of FIG. 2A to couple a main board to the electronic enclosure chassis, according to aspects of the disclosure.

FIG. 2D is a partial cross-sectional view of the chassis 100, illustrating in further detail the coupling between the main board 120 and the array plate 110. Shown in FIG. 2D is an alignment pin 116 having a first portion 116A and a second portion 116B that are coupled to one another via a stop portion 116C. The portion 116A of the alignment pin 116 may be inserted, through array plate 110, into one of a plurality of openings 122 that are formed on the main board 120. More particularly, to make its way through the array plate 110, the portion 116A may be inserted into the inner member 204 of the floating insert 124, which is itself inserted in one of the openings 118 in the array plate 110. The stop member 116C may be sized to prevent the stop portion 116C from entering the opening 118, thereby limiting the depth to which the alignment pin 116 can be inserted into the array plate 110 and the main board 120. As noted above, the inner member 204 and the outer member 202 of the floating insert 124 may be arranged to move relative to one another. In some implementations, the main board 120 may be rigidly coupled to the array plate 110, while the alignment pins in the 116 are permitted to move within the floating insert in order to guide more efficiently electronic modules that are being coupled to main board 120 (e.g., see FIGS. 5A-B, etc.). Alternatively, in some implementations, the main board 120 may be arranged to move (slightly) relative to the array plate 110, thereby allowing main board 120 to align itself with an electronic module assembly 300, when the electronic module assembly 300 is being coupled to the main board 120.

Figure 3A:
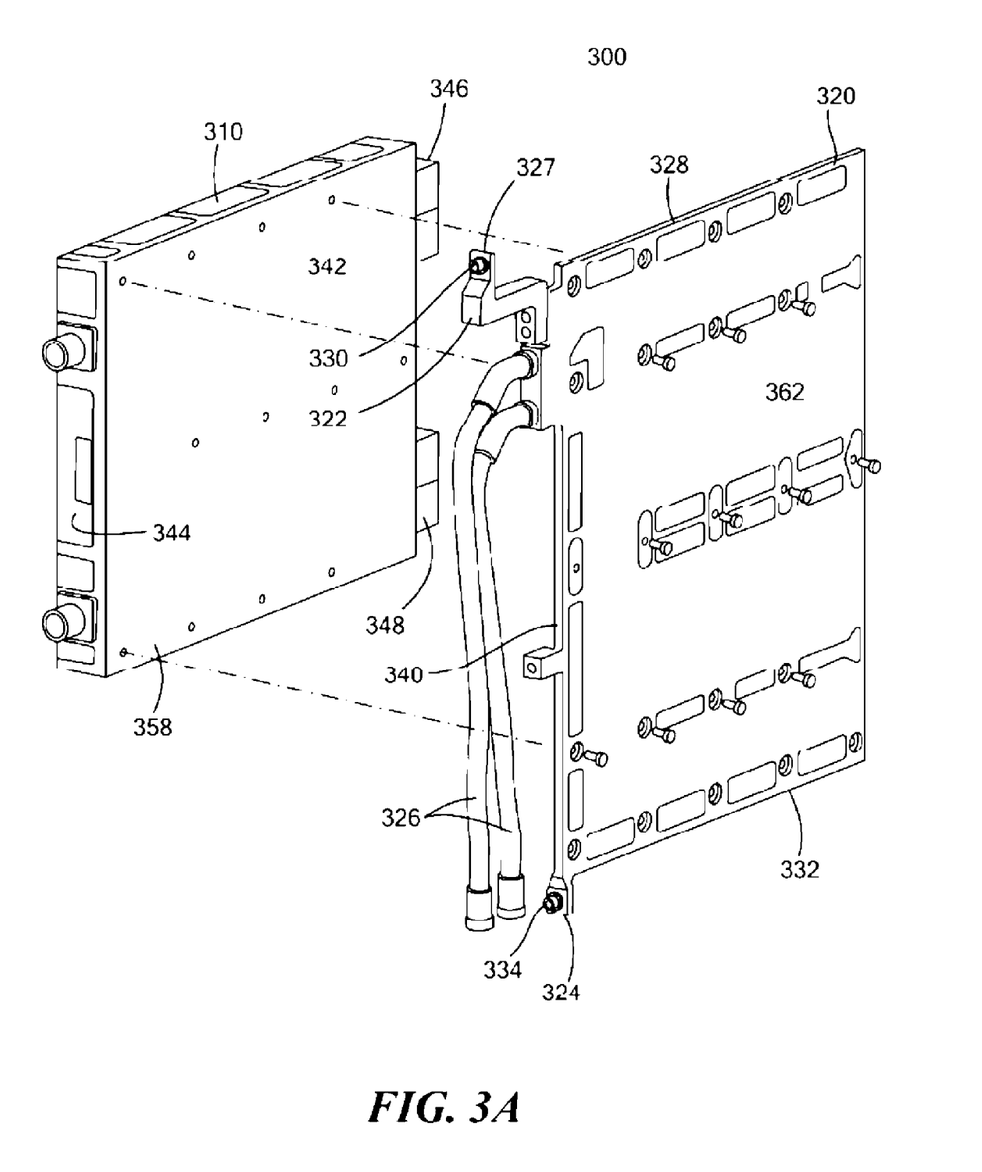
FIG. 3A is an exploded view of an electronic module assembly, according to aspects of the disclosure.
Figure 3B:
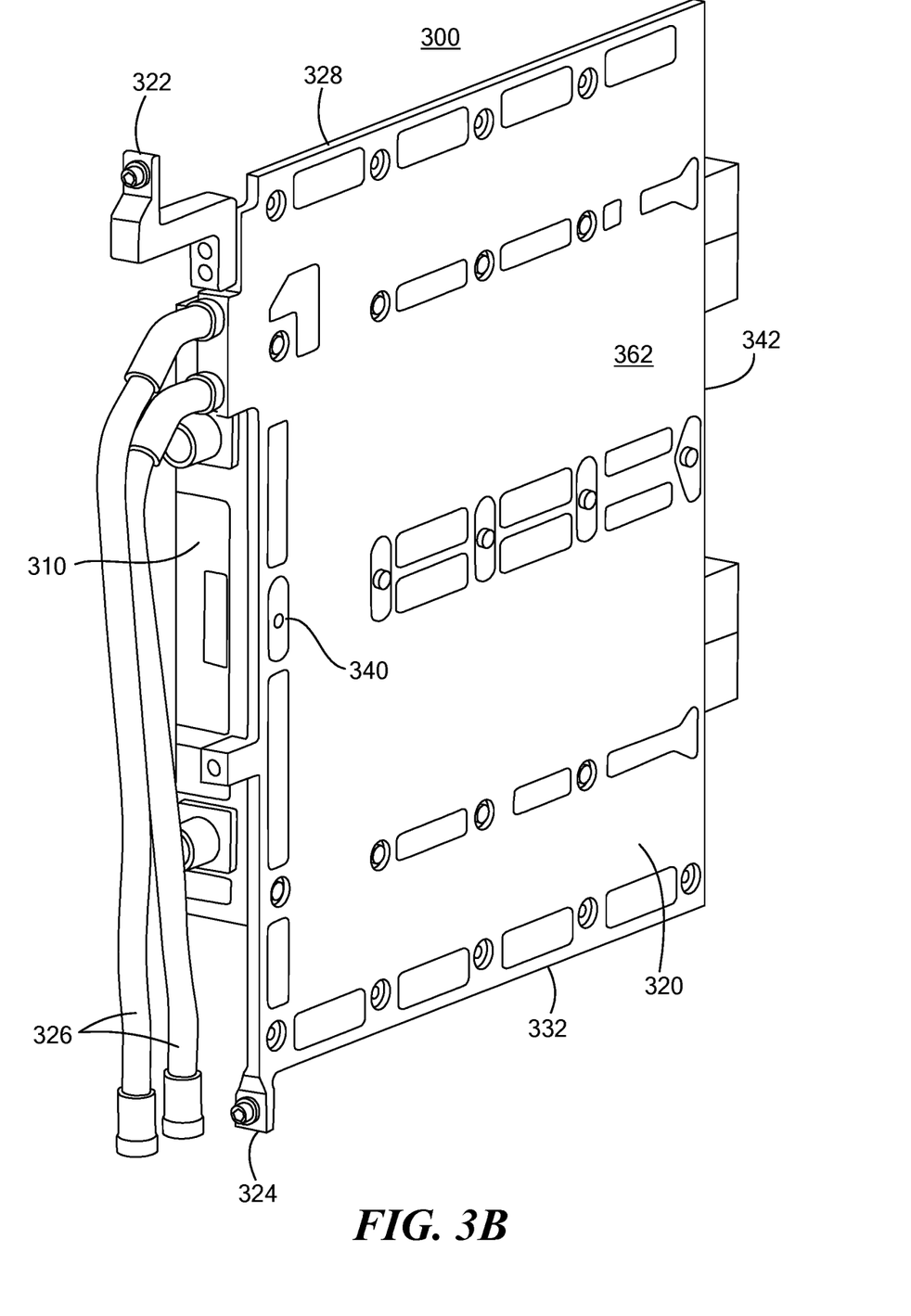
FIG. 3B is a perspective side view of the electronic module assembly of FIG. 3A, according to aspects of the disclosure.
Figure 3C:
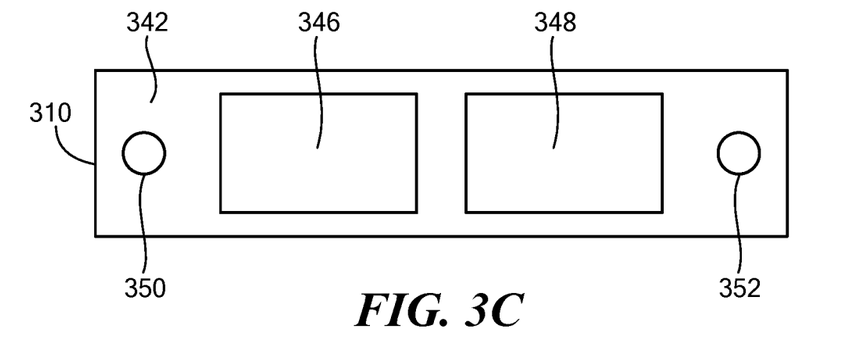
FIG. 3C is a planar side view of an electronic module, according to aspects of the disclosure.

FIGS. 3A-B show an example of the electronic module assembly 300, according to aspects of the disclosure. The electronic module assembly 300 may include an electronic module 310 that is coupled to a cold plate 320. The electronic module 310 may include any suitable type of electronic module, such as a radar array SLAT module, a power converter module, a power amplifier module, a digital receiver/exciter module, or a digital/fiber optic control module, for example. The cold plate 320 may include any suitable type of liquid cooled heatsink. When the electronic module assembly 300 is assembled, a bottom surface 358 of the electronic module 310 may be thermally coupled to the cold plate 320 so as to facilitate heat exchange between the electronic module 310 and the cold plate 320.

The cold plate 320 may include stop members 322 and 324 that are formed on opposite ends of a rear edge 340 of the cold plate 320. The stop member 322 may include a portion 327 that extends above a top edge 328 of the cold plate 320. The portion 327 may have an opening formed thereon that is arranged to receive a fastener 330 (e.g., a captive screw) for securing the electronic module assembly 300 to the chassis 100. The stop member 324 may extend below a bottom edge 332 of the cold plate 320. The stop member 324 may have an opening formed thereon that is arranged to receive a fastener 334 (e.g., a captive screw) for securing the electronic module assembly 300 to the chassis 100. In some implementations, the cold plate 320 may further include coolant hoses 326 that are arranged to circulate coolant across the cold plate 320, when the coolant hoses 326 are coupled to the nozzles 402. The coolant hoses 326 may be disposed adjacently to the rear edge 340 of the cold plate 320, as shown.

Figure 3D:
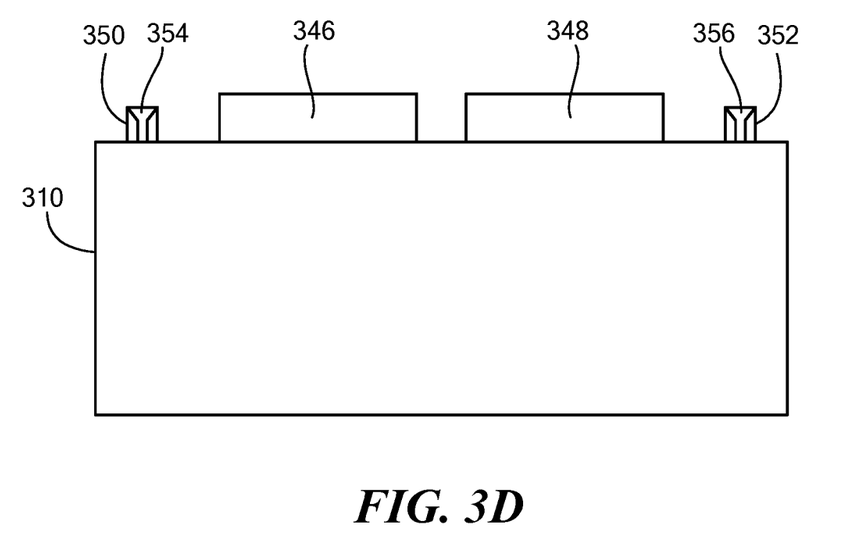
FIG. 3D is another planar side view of the electronic module of FIG. 3C, according to aspects of the disclosure.

The electronic module 310 may include a front sidewall 342 and a rear sidewall 344. When the electronic module assembly 300 is assembled, the front sidewall 342 may be disposed adjacent to a front edge 362 of the cold plate 320, and the rear sidewall 344 may be disposed adjacent to the rear edge 340 of the cold plate 320. A first blind mate connector 346 and a second blind mate connector 348 may be disposed on the front sidewall 342, as shown. A first alignment socket 350 may be disposed on the front sidewall 342 adjacently to the connector 346, and a second alignment socket 352 may be disposed on the front sidewall 342 adjacently to the second connector 348. As illustrated, in FIG. 3D, the alignment socket 350 may include a countersink bore 354 that is arranged to receive the second portion 116B of any of the alignment pins 116. Similarly, the second alignment socket may include a countersink bore 356 that is arranged to receive the second portion 116B of any of the alignment pins 116. Although in the present example the connectors 346 and 348 are male connectors, it will be understood that alternative implementations are possible in which at least one of the connectors 346 and 348 is a female connector. In this regard, it will be understood the present disclosure is not limited to any specific implementation of the connectors 346 and 348. Although in the present example the portions 116A and 116B or the alignment pins are smooth, it will be understood that alternative implementations are possible in which any of the portions 116A and 116B is threaded.

Figure 4A:
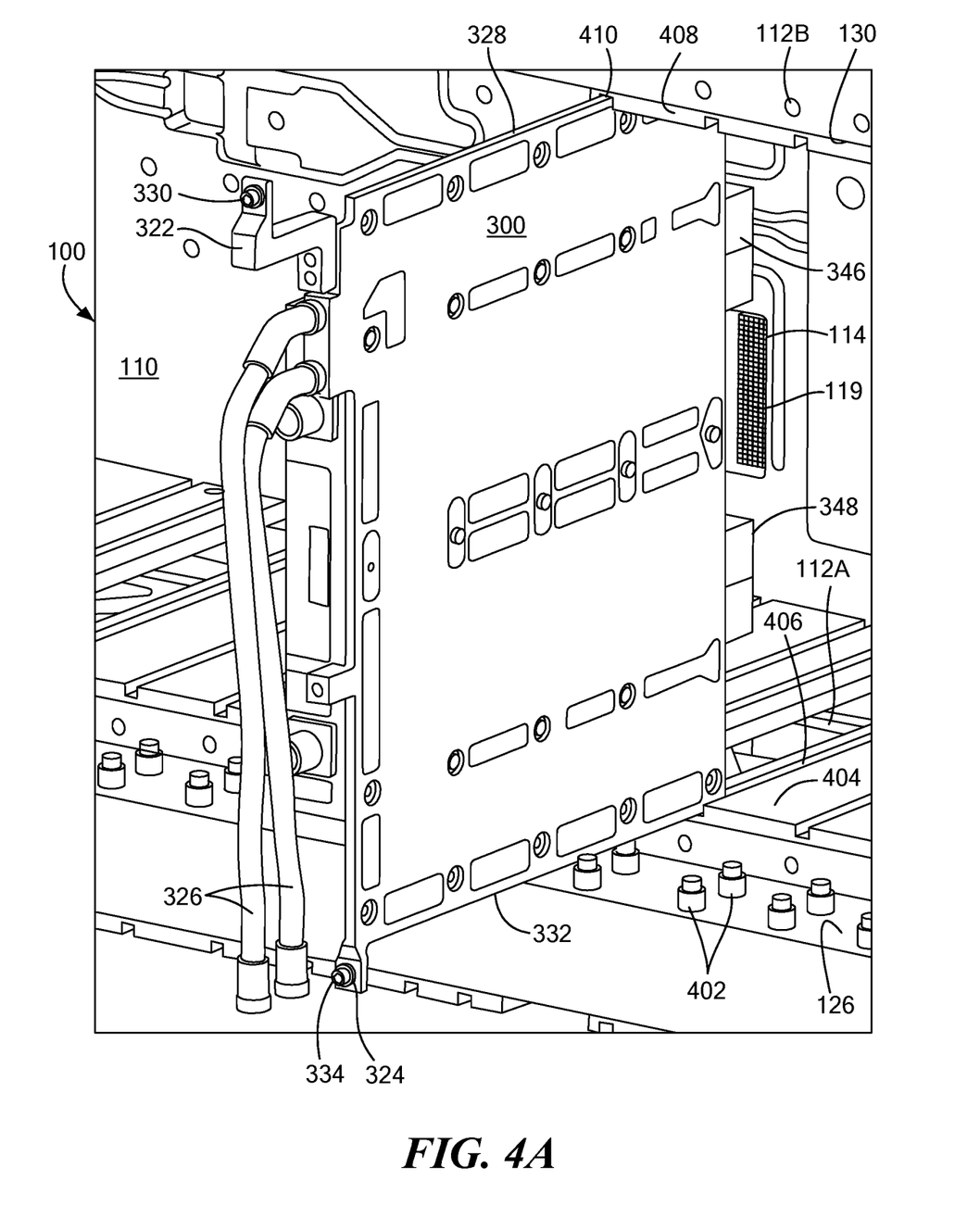
FIG. 4A is a perspective side view illustrating the electronic module assembly of FIG. 3A as the electronic module assembly is being coupled to the electronic enclosure chassis of FIG. 1A, according to aspects of the disclosure.
Figure 4B:
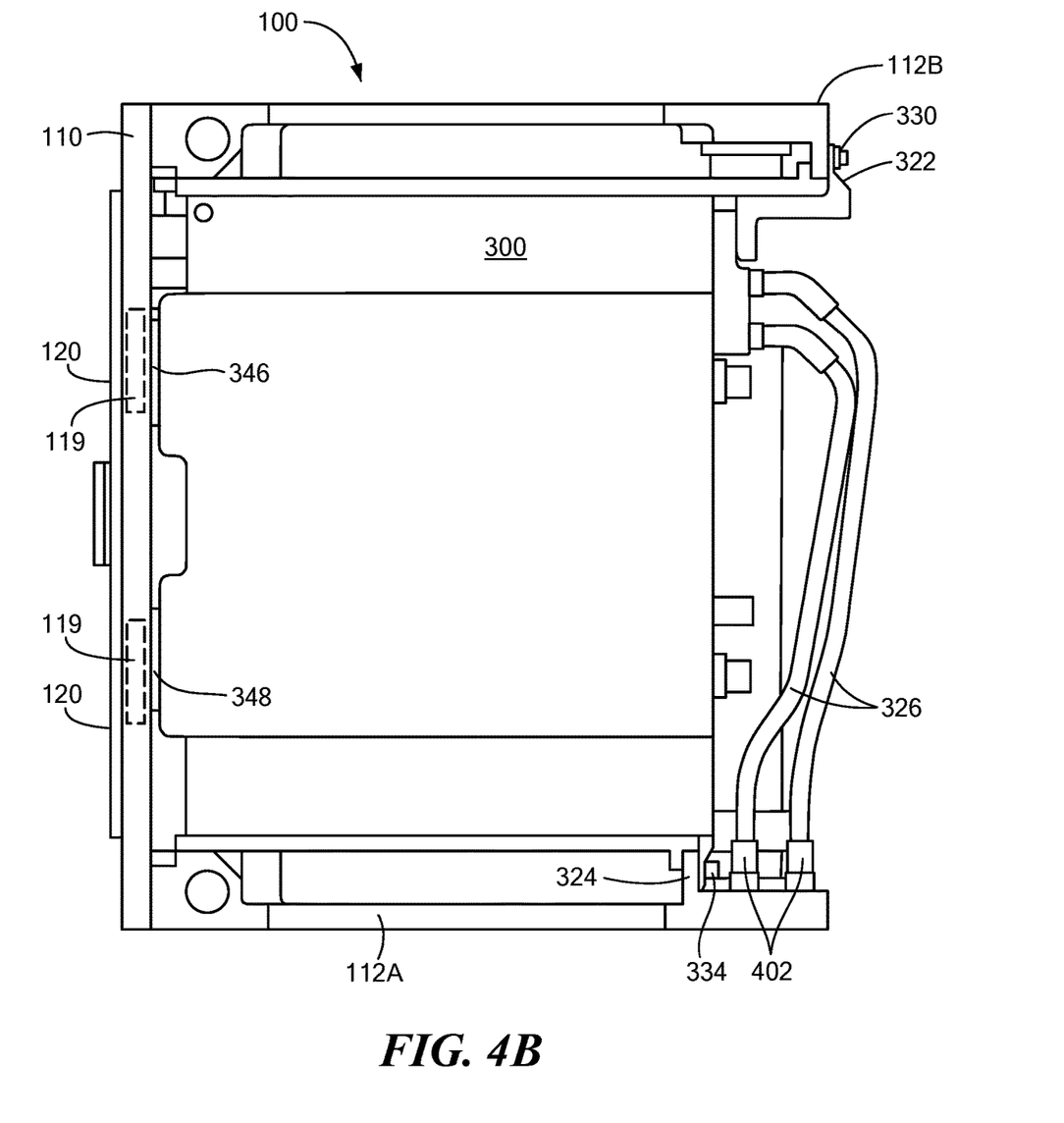
FIG. 4B is a planar side view illustrating the electronic module assembly of FIG. 3A after the electronic module assembly has been coupled to the electronic enclosure chassis of FIG. 1A, according to aspects of the disclosure.

FIGS. 4A-B illustrate the manner in which the electronic module assembly is installed in the chassis 100. As illustrated, the chassis 100 may be provided with nozzles 402, alignment plates 404, and alignment plates 408. The nozzles 402 may be disposed on the outer side 125 of the shelf 112A, where they can be easily inspected by service personnel (e.g., when cover panels of the chassis 100 are removed). The nozzles 402 may be connected to internal piping (not shown) that is configured to deliver coolant to and away from the nozzles 402. The internal piping may be integrated into the shelf 112A or provided separately from the shelf 112A. In some implementations, when the internal piping is provided separately from the shelf 112A, the piping may be run along the bottom surface of the shelf 112A and/or any other suitable portion of the chassis 100. The alignment plates 404 may be disposed on the top surface 128 of the shelf 112A, and the alignment plates 408 may be disposed on the bottom surface 130 of the shelf 112B. Each of the alignment plates 404 may include one or more grooves 406, and each of the alignment plates 408 may include one or more grooves 410. As illustrated, each of the grooves 410 may be arranged to face a corresponding one of the grooves 406, which is situated directly beneath (or at a predetermined offset from) the groove 410. In some implementations, the alignment plates 404 and 408 may be formed of Delrin™ plastic and/or any other suitable material.

FIG. 4A shows the electronic module assembly 300 as the electronic module assembly 300 is being advanced towards the array plate 110 and the main board 120, which sits behind the array plate 110. When the electronic module assembly 300 is mounted in the chassis 100, the top edge 328 of the electronic module assembly 300 is inserted in one of the grooves 410 of the alignment plates 408, and the bottom edge 332 of the electronic module assembly 300 is inserted in a corresponding one of the grooves 406 of the alignment plates 404. After the top and bottom edges of the electronic module assembly 300 are inserted into the grooves 406 and 410, respectively, the electronic module assembly 300 is pressed gently towards the array plate 110. As the electronic module assembly 300 is being pressed, the electronic module assembly 300 is guided towards the main board 120 by the grooves 406/410 until the connectors 346 and 348 of the electronic module assembly 300 are mated with the connectors 119 on the main board 120.

FIG. 4B shows the electronic module assembly 300 after the connectors 346 and 348 of the electronic module assembly 300 are mated with the connectors 119. After the connectors 346 and 348 of the electronic module assembly 300 are mated with the connectors 119 on the main board 120, the stop member 322 may be secured to the shelf 112B by attaching (e.g., screwing) the fastener 330 to the outer side 125 of the shelf 112B. Similarly, after the connectors 346 and 348 are mated with the connectors 119 on the main board 120, the stop member 324 may be secured to the shelf 112A by attaching (e.g., screwing) the fastener 334 to the outer side 126 of the shelf 112A. Furthermore, after the connectors 346 and 348 of the electronic module assembly 300 are mated with the connectors 119, the coolant hoses 326 may be coupled to respective nozzles 402, thereby allowing coolant to flow in and out of the cold plate 320. In some respects, the use of the coolant hoses 326 and the nozzles 402 to connect electronic module assembly to a cooling unit may be advantageous as it may compensate for any imprecisions in the mounting of the electronic module 300 within the chassis 100.

Figure 5A:
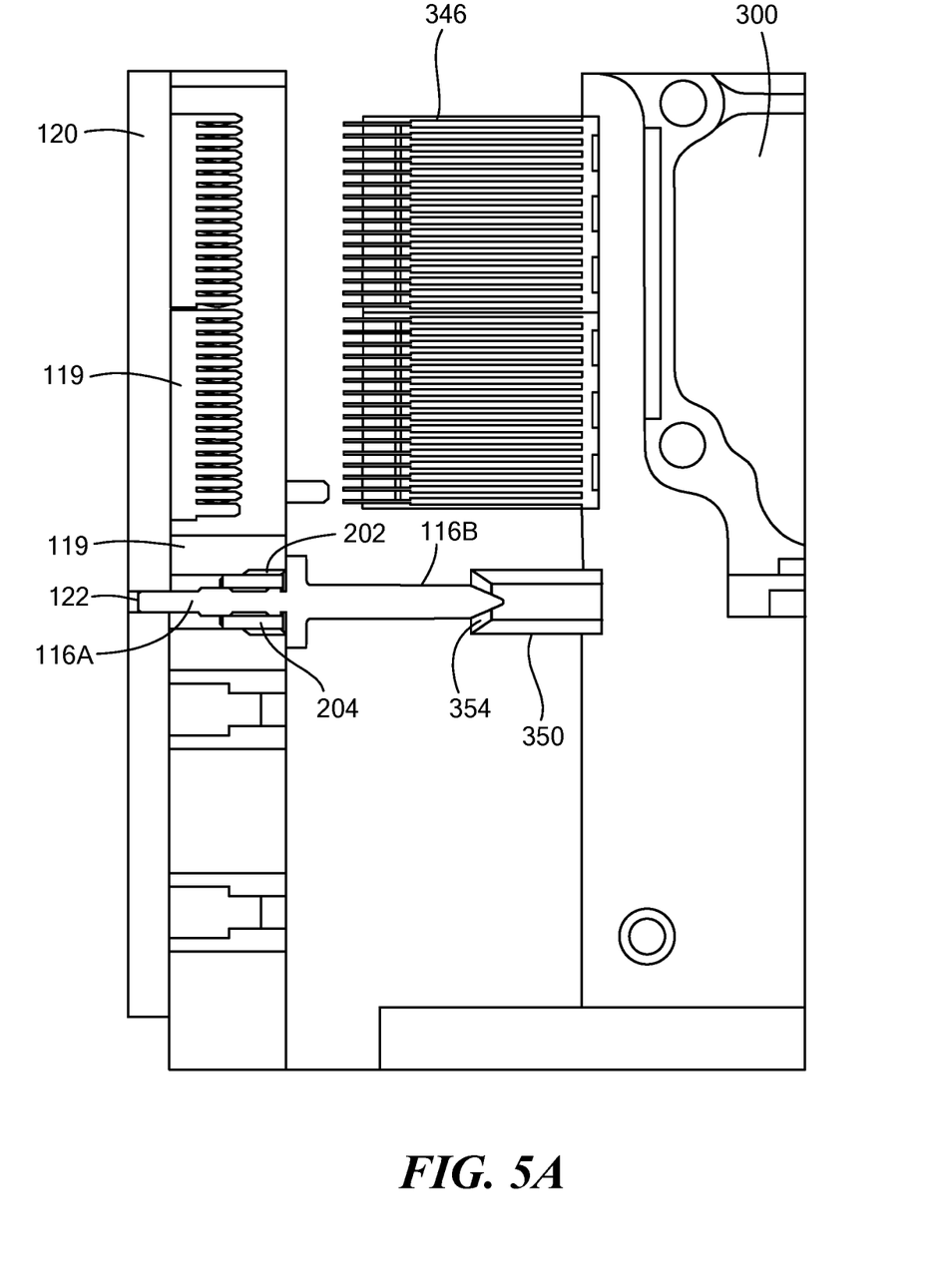
FIG. 5A is a partial side view illustrating the manner in which the electronic module assembly of FIG. 3A is coupled to the electronic enclosure chassis of FIG. 1A, according to aspects of the disclosure.
Figure 5B:
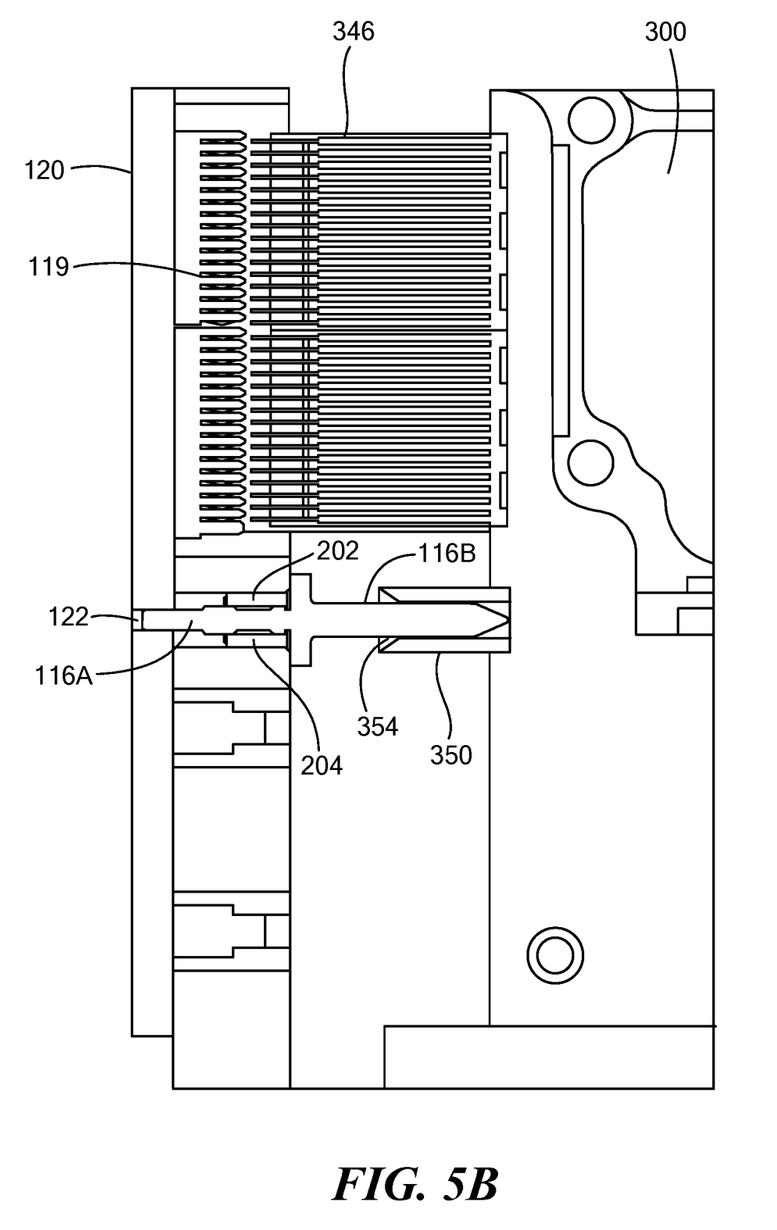
FIG. 5B is a partial side view illustrating the manner in which the electronic module assembly of FIG. 3A is coupled to the electronic enclosure chassis of FIG. 1A, according to aspects of the disclosure.

FIGS. 5A-B illustrate in further detail the interaction that takes place between the electronic module assembly 300 and the main board 120 when the electronic module assembly 300 is installed in the chassis 100. As illustrated, when the electronic module assembly 300 is advanced along the grooves 406 and 410 towards the main board 120, the alignment pin 116 may be disposed on chassis 100 in such a way that the portion 1168 of the alignment pin 116 engages the alignment socket 350 before the connector 346 has made physical contact with the connector 119. As noted above, the inner member 204 of the floating insert 124 is arranged to move relative to the outer member 202 of the floating insert 124. As a result of this arrangement, when the alignment socket 350 of the electronic module assembly 300 engages the portion 1168 of the alignment pin 116, pressure that is applied on the portion 1168 (by the alignment socket 350) causes the electronic module assembly 300 to move, making it easier for the alignment pin 116 to enter the countersink bore 354 of the alignment socket 350 and guide the electronic module assembly 300 towards the main board 120.

Traditional chassis designs use printed flex cables to couple various electronic modules to the main board of a radar array. However, these designs often require the use of shoulder screws to give the flex cables enough radial play, and they may need additional chassis depth to be provided in order to ensure a minimum bend radius. Moreover, some designs that are based on flex cables may also use springs and other similar components to overcome the insertion force of electrical connectors. In some respects, the chassis design described with respect to FIGS. 1A-5B may be advantageous over traditional chassis designs because it does away with the need to use flex cables and other associated components. Moreover, the use of blind-mating allows the depth of the chassis 100 to be reduced because there is no need any more to provide additional chassis depth for accommodating flex cable bend radius.

Furthermore, traditional chassis designs often rely on edge-cooling to remove heat from electronic components. Liquid cooling has been historically viewed with suspicion in applications where high reliability is required due to the potential for coolant leaks. In the regard, placing the coolant hoses 326 in the back of the electronic module assembly 300, and in proximity to the periphery of the chassis 100, is advantageous because it allows the coolant hoses 326 to be reliably inspected by technical personnel to ensure that no leaks are occurring.

Although the chassis 100 is used in radar arrays, the present disclosure is not limited to any specific application. It will be understood that the principles and ideas discussed throughout the disclosure can be employed in any suitable type of electronics enclosure. As used in this application, the term "opening" may refer to a through hole, a blind hole, and/or any other suitable type of opening. As used in this application, the term "connector" may refer to any suitable type of electrical connector, which includes one or more electrical contacts. As used in this application, the term "electronic module assembly" may refer to any combination of a circuit board and additional hardware for cooling and/or mounting the circuit board. For example, an electronic module assembly may include a circuit board and a heat sink that is mounted one or more components of the circuit boards. As another example, an electronic module assembly may refer to a circuit board and a mounting bracket that is coupled to the circuit board. As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program, Such software may be employed in, for example, a digital signal processor, micro-controller, or general-purpose computer.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. An apparatus comprising:
   a chassis including an array plate, the array plate having a plurality of first openings formed thereon;
   a plurality of floating inserts, each of the floating inserts being disposed in a different one of the first openings, each of the floating inserts including a first floating insert member and a second floating insert member that is inserted in the first floating insert member and arranged to move laterally with respect to the first floating insert member;
   a main board having a plurality of second openings formed thereon, the main board being coupled to the array plate via a plurality of alignment pins, each of the alignment pins having a first portion and a second portion, the first portion of each of the alignment pins extending through a respective one of the plurality of second openings and into the second floating insert member of a respective one of the plurality of floating inserts; and
   at least one electronic module assembly coupled to the main board, the electronic module assembly having a first connector and at least one alignment socket that are formed on a first side of the electronic module assembly, the first connector being mated with a second connector that is disposed on the main board, and each of the at least one alignment socket being mated with the second portion of a given one of the plurality of alignment pins.

2. The apparatus of claim 1, wherein the electronic module assembly includes a pair of coolant hoses disposed on a second side of the electronic module assembly that is opposite the first side, each of the pair of coolant hoses being coupled to a different respective coolant nozzle that is disposed on the chassis.

3. The apparatus of claim 1, wherein the chassis further includes at least one shelf disposed transversely with respect to the array plate, the at least one shelf including a guide plate arranged to guide the electronic module assembly towards the main board when the electronic module assembly is being coupled to the main board.

4. The apparatus of claim 1, wherein the chassis further includes at least one shelf disposed transversely with respect to the array plate, the at least one shelf including an inner side that is disposed adjacently to the array plate and an outer side having a plurality of coolant nozzles disposed thereon.

5. The apparatus of claim 1, wherein each of the at least one alignment socket includes a countersink bore that is arranged to receive the second portion of the given one of the alignment pins.

6. The apparatus of claim 1, wherein the electronic module assembly includes an electronic module coupled to a cooling plate.

7. The apparatus of claim 1, wherein the second floating insert member is coupled to the first floating insert member via a locking ring that is partially disposed in a groove formed on an interior surface of the first floating insert member and sized to prevent the second floating insert member from exiting the first floating insert member.

8. The apparatus of claim 1, wherein the electronic module assembly includes at least one stop member that is formed on a second side of the electronic module assembly that is opposite the first side.

9. The apparatus of claim 1, wherein the electronic module assembly and the main board are disposed on opposite sides of the array plate, and the second connector is exposed by a third opening in the array plate.

10. An apparatus comprising:
    a chassis including an array plate, the array plate having a plurality of first openings formed thereon;
    a plurality of floating inserts, each of the floating inserts being disposed in a different one of the first openings;
    a main board having a plurality of second openings formed thereon, the main board being coupled to the array plate via a plurality of alignment pins, each of the alignment pins extending through a respective one of the plurality of floating inserts and into a respective one of the second openings; and
    at least one electronic module assembly coupled to the main board, the electronic module assembly including a first connector and at least one alignment socket, the first connector being coupled to a second connector that is disposed on the main board, each of the at least one alignment socket being arranged to receive a given one of the alignment pins.

11. The apparatus of claim 10, wherein the chassis includes a plurality of coolant nozzles, and the electronic module assembly includes a pair of coolant hoses, each of the coolant hoses being coupled to a different one of the plurality of coolant nozzles.

12. The apparatus of claim 10, wherein the chassis further includes at least one shelf disposed transversely with respect to the array plate, the at least one shelf including a guide plate arranged to guide the electronic module assembly towards the main board when the electronic module assembly is being coupled to the main board.

13. The apparatus of claim 10, wherein the chassis further includes at least one shelf disposed transversely with respect to the array plate, the at least one shelf including an inner side that is disposed adjacently to the array plate and an outer side having a plurality of coolant nozzles disposed thereon.

14. The apparatus of claim 10, wherein each of the at least one alignment socket includes a countersink bore that is arranged to receive the given one of the alignment pins.

15. The apparatus of claim 10, wherein the electronic module assembly includes an electronic module coupled to a cooling plate.

16. The apparatus of claim 10, wherein the floating insert includes a first floating insert member and an a second floating insert member that is inserted into the first floating insert member, the second floating insert member being secured within the first floating insert member via a locking ring that is partially disposed in a groove formed on an interior surface of the first floating insert member and sized to prevent the second floating insert member from exiting the first floating insert member.

17. The apparatus of claim 10, wherein the electronic module assembly includes at least one stop member that is fastened to the chassis.

18. The apparatus of claim 10, wherein the electronic module assembly and the main board are disposed on opposite sides of the array plate, and the second connector is exposed by a third opening in the array plate.

19. An apparatus comprising:
a chassis including an array plate, the array plate having a plurality of first openings formed thereon;
a plurality of floating inserts, each of the floating inserts being disposed in a different one of the first openings;
a main board having a plurality of second openings formed thereon, the main board being coupled to the array plate via a plurality of alignment pins, each of the alignment pins extending through a respective one of the plurality of floating inserts and into a respective one of the plurality of second openings; and
an electronic module coupled to the main board, the electronic module including a first connector and at least one alignment socket, the first connector being coupled to a second connector that is disposed on the main board, each of the at least one alignment socket being arranged to receive a given one of the alignment pins.

20. The apparatus of claim 19, wherein the electronic module and the main board are disposed on opposite sides of the array plate, and the second connector is exposed by a third opening in the array plate.

21. A method comprising:
mounting a main board on an array plate of a chassis by using a plurality of floating inserts and a plurality of alignment pins, each of the floating inserts being disposed in a different respective opening in the array plate, and each of the alignment pins extending through a respective one of the floating inserts and into a respective opening in the main board;
blind mating an electronic module assembly to the main board, the electronic module assembly including an alignment socket and a first connector, the blind mating including coupling the alignment socket with a given one of the plurality of alignment pins that is disposed adjacent to a second connector on the main board, and mating the first connector with the second connector,
wherein the electronic module assembly and the main board are disposed on opposite sides of the array plate.

22. The method of claim 21, wherein:
the given floating insert includes a first floating insert member and a second floating insert member, the second floating insert member being disposed inside the first floating insert member, the second floating insert member being arranged to move laterally with respect to the first floating insert member, and
the alignment pin includes a first portion and a second portion, the first portion extending through the second floating insert member and into one of the openings on the main board, and the second floating insert member being coupled to the alignment socket of the electronic module assembly.

\* \* \* \* \*